United States Patent [19]

Yamada

[11] Patent Number: 5,892,718
[45] Date of Patent: Apr. 6, 1999

[54] SEMICONDUCTOR MEMORY DEVICE HAVING A REDUNDANCY FUNCTION

[75] Inventor: Yukinori Yamada, Tokyo, Japan

[73] Assignee: NEC Corporation, Tokyo, Japan

[21] Appl. No.: 934,539

[22] Filed: Sep. 22, 1997

[30] Foreign Application Priority Data

Sep. 20, 1996 [JP] Japan ................................. 8-250245

[51] Int. Cl.$^6$ ............................................. G11C 7/00
[52] U.S. Cl. ................ 365/200; 365/230.03; 365/225.7
[58] Field of Search ............................ 365/200, 230.03, 365/225.7, 230.06

[56] References Cited

U.S. PATENT DOCUMENTS 5,661,689  8/1997  Shinkai ................................. 365/200

FOREIGN PATENT DOCUMENTS 3-58398  3/1991  Japan .
3-59895  3/1991  Japan .
7-65595  3/1995  Japan .

*Primary Examiner*—Vu A. Le
*Attorney, Agent, or Firm*—Foley & Lardner

[57] ABSTRACT

A semiconductor memory device comprises memory cell blocks M1–Mn disposed for respective I/O pads and a redundant memory cell block MR, a programmable circuit programmable based on a failed information for controlling transfer switches T1 and T2 to couple each of the I/O pads with corresponding memory cell block or with adjacent memory cell block by excepting a failed memory cell block and including the redundant memory cell block based on the failed information. In a roll call test mode, the I/O pads coupled with adjacent memory cell blocks output a fixed value regardless of data stored in the memory cell blocks to notify a failed memory cell block for facilitating failure analysis.

7 Claims, 5 Drawing Sheets

SEMICONDUCTOR MEMORY DEVICE HAVING A REDUNDANCY FUNCTION

BACKGROUND OF THE INVENTION (a) Field of the Invention

The present invention generally relates to a semiconductor memory device having a redundancy function and, more specifically, to a discriminating circuit provided in the semiconductor memory device for judging whether or not a redundancy function has been used to substitute for a failed memory block.

(b) Description of the Related Art

Recently, a semiconductor memory device is generally designed to include redundant memory cells for a redundancy function to replace failed memory cells by the redundant memory cells, thereby enhancing the product yield of the memory device with an increased storage capacity. Such a semiconductor memory device is often provided with a roll call circuit for discriminating whether or not the redundant memory cells have been used, for the purpose of failure analysis or product evaluation.

FIG. 1 shows an example of a conventional roll call circuit, proposed in Patent Publication NO. JP-A-7(1995)-65595. The disclosed roll call circuit comprises a data output block DO1, a first read circuit 13 for reading data from a sense amplifier block, and a second read circuit 16 for reading the result of a roll call test. The data output block DO1 amplifies data on a write/read bus line pair WRBT/WRBN and outputs the amplified data through I/O pads. The first read circuit 13 receives data from the sense amplifier block (not illustrated) and outputs the data through the bus line pair WRBT/WRBN. The second read circuit 16 outputs the result of the roll call test to the bus line pair WRBT/WRBN.

The proposed roll call circuit further comprises a redundancy decoder 17, an X-decoder 18 and a roll call decoder 14. The redundancy decoder 17 receives through external pins A1–An (not-illustrated) address signals ADD1–ADDn, which are "High" or "Low" depending on "1" or "0" given to the external pins A1–An. The X-decoder 18 receives an address signal ADD0 which is "High" or "Low" depending on the signal given to an external pin A0, the address signals ADD1–ADDn and a signal RDS output from the redundancy decoder 17. The roll call decoder 14 receives the signal RDS from the redundancy decoder 17, a signal YRD from an address transition detector ("ATD") 19 and a test mode signal TM for allowing the memory device enter into a test mode.

The first read circuit 13 comprises a pair of N-channel transistors T20 and T21 and a NOR gate N04. The pair of n-channel transistors T20 and T21 function as transfer gates between a data line pair RBT/RBN from the sense amplifier block and the bus line pair WRBT/WRBN. The NOR gate N04 receives a signal RCE from the second read circuit 16 and a signal BSLB at the inputs thereof, and supplies an output signal to the gate of the transistors T20 and T21.

The second read circuit 16 comprises a NOR gate NO3 and a pair of N-channel transistors T18 and T19. The NOR gate NO3 receives a signal RCSB from the roll call decoder 14 and a test mode signal TM at the inputs thereof. The transistor T18 receives the signal RCE at the gate electrode thereof from the NOR gate NO3 and functions as a transfer gate between the ground ("GND") and the bus line WRBN. The transistor T19 functions as the transfer gate between the source line and the bus line WRBT.

The bus line pair WRBT/WRBN are clamped to the power source level by a clamp circuit 15 comprising gate-grounded pair of P-channel transistors T7 and T8 having a relatively small capacity for supplying a small charging current.

In a normal read operation mode of the proposed roll call circuit, the test mode signal TM is "High" since it is "Low" only during a roll call test, and therefore, the signal RCE is "Low". It follows that the N-channel transistors T20 and T21 are "ON" for a period while the input signal BSLB is "Low", and data supplied from the sense amplifier block through the data line pair RBT/RBN are fed to the I/O pads through the bus line pair WRBT/WRBN and the data output block DO1. In this case, no data are delivered to the bus line pair WRBT/WRBN from the second read circuit 16, because the signal RCE is "Low" and accordingly the transistors T18 and T19 are "OFF".

In operation for a roll call test mode, since the test mode signal TM is "Low" during the roll call test, data on the bus line pair WRBT/WRBN are determined in accordance with the level of the signal RCSB. If the signal RCSB is "Low", then the signal RCE is "High", causing the transistors T18 and T19 to be "ON", and the transistors T20 and T21 to be "OFF", thereby maintaining WRBT at "High" and WRBN at "Low". These data on the bus line pair WRBT/WRBN are delivered to the I/O pads through the data output block DO1. On the contrary, if the signal RCSB is "High", then the transistors T18 and T19 are "OFF" and the transistors T20 and T21 are "ON" for a period while the signal BSLB is "Low". The data from the sense amplifier block are, therefore, delivered to the I/O pads through the bus line pair WRBT/WRBN and the data output block DO1.

The X-decoder 18 decides which digit line is to be selected, in accordance with the address signals ADD0 and ADD1–ADD9. The redundancy decoder 17 decides whether or not a redundancy digit line is to be selected. The address transition detector 19 generates a one-shot pre-charging signal YRD for a dynamic circuit in the roll call decoder 14. In the roll call test mode, the roll call decoder 14 generates the output signal RCSB depending on the result of the roll call test. Accordingly, if data have been written into memory cells beforehand so that the data line RBT from the sense amplifier block is made "Low" and the data line RBN "High", the signal delivered to the I/O pads can be altered depending on "High" or "Low" of the signal RCSB. It follows that if the roll call test as described above is conducted while the combination of "High" and "Low" of the address signals ADD1–ADD9 is altered, it is possible to decide which redundant digit line has been used by determining the signals appearing on the I/O pads.

Referring to FIG. 2, the roll call decoder 14 shown in FIG. 1 comprises inverters I6–I8, a P-channel transistor T9, and N-channel transistors T22 and T23. The inverter I6 receives the one-shot pre-charging signal YRD, and the P-channel transistor T9 receives the test mode signal TM. The P-channel transistor T10 is connected in series with the transistor T9 between the source line and a pre-charge node, and receives an output signal from the inverter I6 at the gate thereof. The N-channel transistor T22, interposed between the pre-charge node and the GND, receives the test mode signal TM at the gate thereof. The N-channel transistor T23, connected in parallel with the transistor T22, receives the signal RDS from the redundancy decoder 7 at the gate thereof. The cascaded inverters I7 and I8 receiving an input signal from the pre-charge node raises the amplitude of the pre-charge node to thereby generate the output signal RCSB.

In operation of the roll call decoder 14 during a roll call test, since the test mode signal TM is "Low", the pre-charge node is pre-charged to the power source level during a high level of a one-shot signal YRD. However, if the signal RDS is "High", the level of the pre-charge node is determined by the resistance divisional ratio of the transistors T9, T10 and T23. The output signal RCSB is obtained by the inverter I7 having a ratio that makes the output "High" for that level of the pre-charge node, in association with the inverter I8. Since the test mode signal TM is "High" for the periods other than the roll call test, the pre-charge node is fixed at the GND level.

The signal RDS from the redundancy decoder 17 is "High" if the redundancy memory cells have been used, and "Low" if not. Accordingly, it is possible to judge whether or not the redundancy function has been used, by detecting the output signal of the redundancy decoder 17.

However, in a conventional semiconductor memory device of a type in which failed memory cells are replaced by redundant memory cells on a block-by-block basis, there exists no signal showing uniquely which memory cell block has been replaced because of the failure thereof. In this case, analysis of the cause of the failure is difficult.

SUMMARY OF THE INVENTION

It is therefore an object of the present invention to improve a semiconductor memory device of a type having a redundancy function, wherein failed memory cells are replaced on an I/O-by-I/O basis, which is capable of detection whether or not and to which memory cells the redundancy function has been used.

The semiconductor memory device according to the present invention comprises: a plurality of memory cell blocks consecutively disposed in order and including a plurality of normal memory cell blocks and a redundant memory cell block successive to the normal memory cell blocks; an I/O block including a plurality of I/O pads each corresponding to one of the normal memory cell blocks; a programmable circuit programmable for storing data of a failed memory cell block among the normal memory cell block to output redundancy control data; a switching section for coupling the I/O pads with the respective memory cell blocks based on the redundancy control data while excepting the failed memory cell block and including the redundant memory cell block; a data read section for reading data through the I/O pads; and a roll call circuit for controlling the data read section while controlling the data for specified I/O pads coupled with the failed memory cell blocks and succeeding memory cell blocks at a specified value.

In accordance with the present invention, the failed memory cell block can be identified by the output from the I/O pads after fabrication of the semiconductor memory device, which facilitates evaluation or analysis of the failure in the failed memory device.

The above and other objects, features and advantages of the present invention will be more apparent from the following description, referring to the accompanying drawings.

DESCRIPTION OF THE PREFERRED EMBODIMENTS

Figure 1:
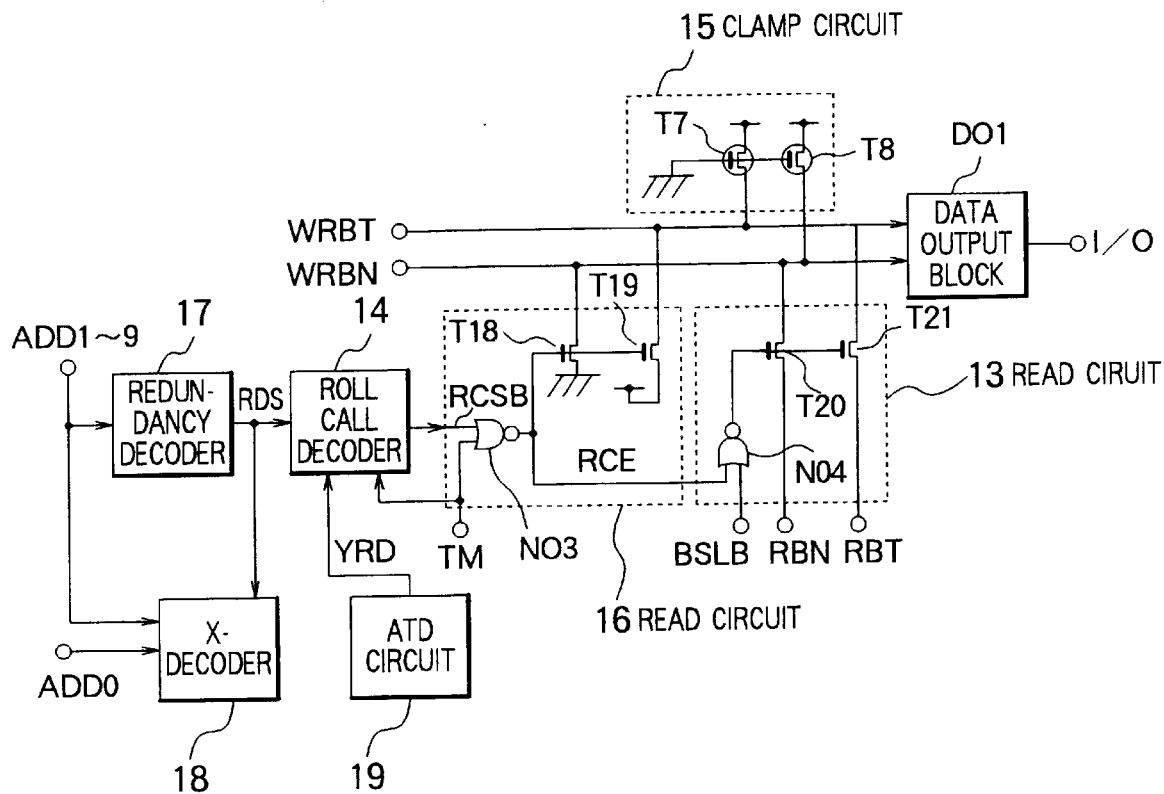
FIG. 1 is a circuit diagram of a conventional semiconductor memory device.
Figure 2:
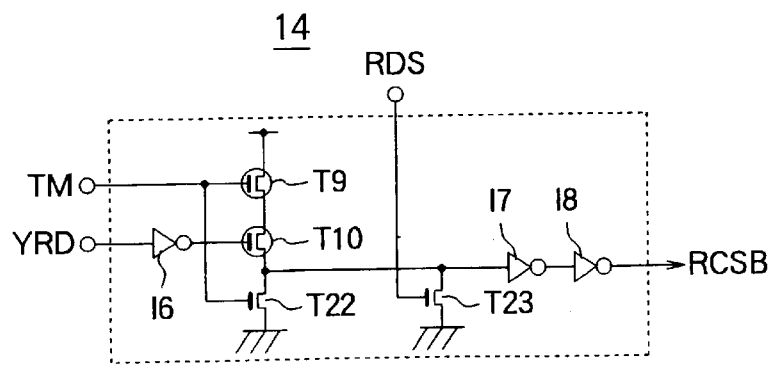
FIG. 2 is a circuit diagram of the roll call decoder shown in FIG. 1.

Now, the present invention is more specifically described with reference to accompanying drawings, wherein similar constituent elements are designated by the same or similar reference numerals.

Figure 3:
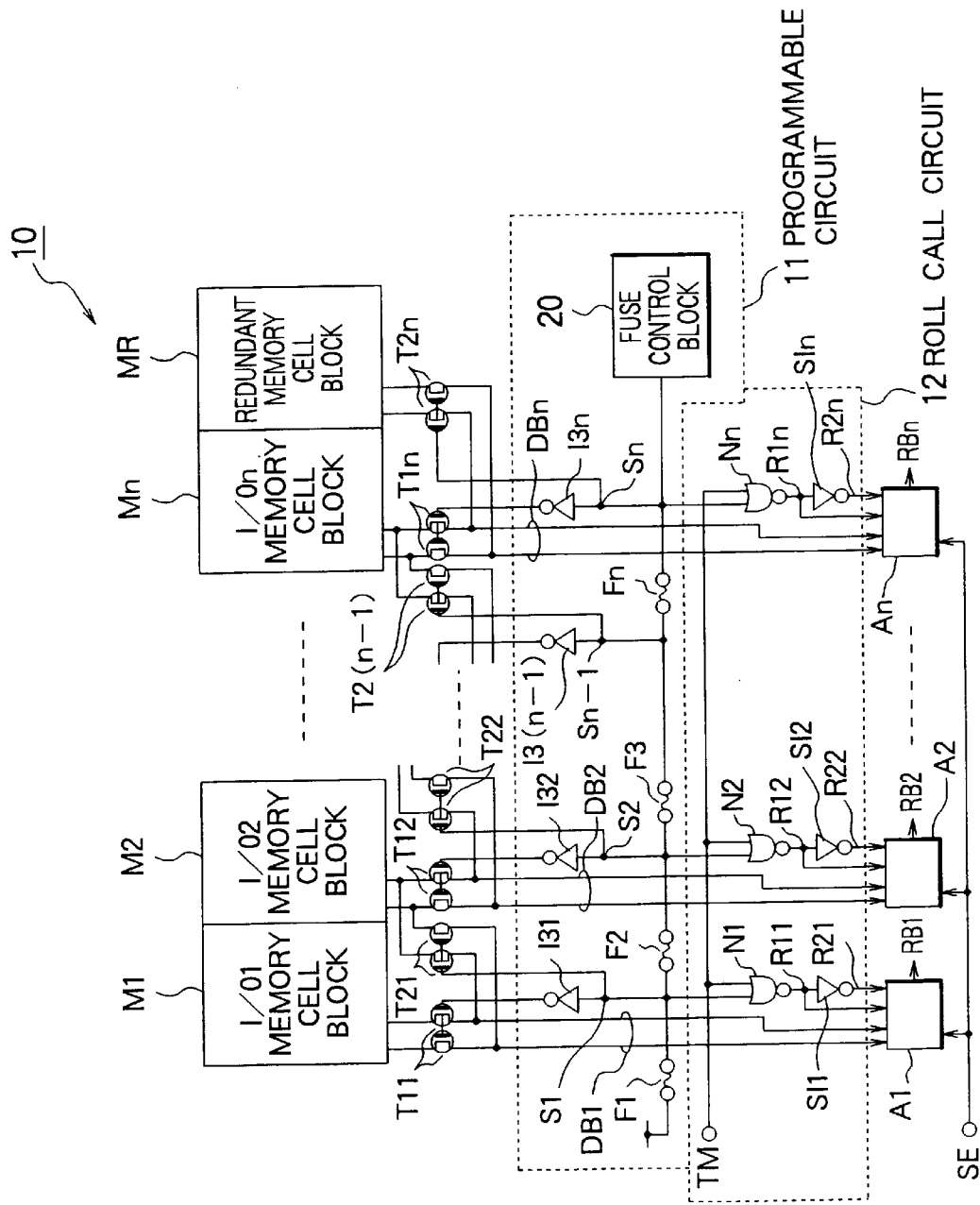
FIG. 3 is a circuit diagram of a semiconductor memory device according to a first embodiment of the present invention.

Referring to FIG. 3 showing a semiconductor memory device according to a first embodiment of the present invention, the memory device generally designated by numeral 10 comprises a plurality of memory sections, although one of the memory sections is shown in the figure. Each of the memory sections has a plurality of memory cell blocks M1–Mn corresponding to respective IO pads I/O1–I/On (not shown specifically in the figure) and a single redundant memory cell block MR. The memory section further comprises a programmable circuit 11, a plurality of pairs of first P-channel transistors T11–T1n, a plurality of pairs of second P-channel transistors T21–T2n.

The pairs of transistors T11–T1n act as transfer gates for coupling the memory cell blocks M1–Mn with respective data bus line pairs DB1–DBn, whereas the pairs of transistors $T_{21}$–$T_{2(n-1)}$ act as transfer gates for coupling the memory cell blocks M2–Mn to respective preceding data bus line pairs $DB_1$–$DB_{n-1}$ and the pair of transistors T2n act as tranfer gates for coupling the redundant memory cell block MR to the data bud line pair Mn.

The programmable circuit 11 comprises a fuse control block 20, a plurality of fuse elements F1–Fn of low resistance connected in series between a source line and the output node Sn of the fuse control section 20 and a plurality of inverters I31–I3n, disposed in association with the respective fuse elements F1–Fn, for controlling the use of the redundant memory cell block based on whether or not the fuse elements F1–Fn have been cut.

The memory section of the memory device further comprises sense amplifier blocks A1–An for amplifying data supplied through the respective data bus line pairs DB1–DBn and transferring the amplified data to the data output blocks (not illustrated), and a roll call circuit 12 having NOR gates N1–Nn for receiving the output signals of the programmable circuit 11 from nodes S1–Sn and a test mode signal TM supplied from outside the memory device, inverters SI1–SIn for receiving respective output signals through nodes R11–R1n from the NOR gates N1–Nn. Output signals from the NOR gates N1–Nn through nodes R11–R1n and output signals from the inverters SI1–SIn through nodes R21–R2n are supplied to the respective sense amplifier blocks A1–An.

Figure 4:
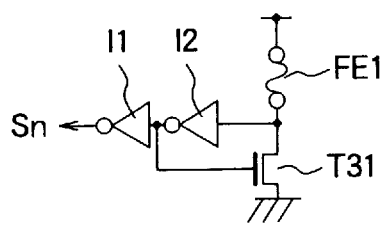
FIG. 4 is a circuit diagram of the fuse control block shown in FIG. 3.

Referring to FIG. 4, the fuse control block 20 comprises a serial branch of a fuse element FE1 of low resistance and an N-channel transistor T31 connected between a source line and the GND line, a first inverter I2 having an input connected to a node connecting the fuse element FE1 and N-channel transistor T31, and a second inverter I1 having an input connected to the output of the first inverter I2. The gate electrode of the transistor T31 is connected to the output of the first inverter I2. The transistor T31 has a relatively small capacity.

Figure 5:
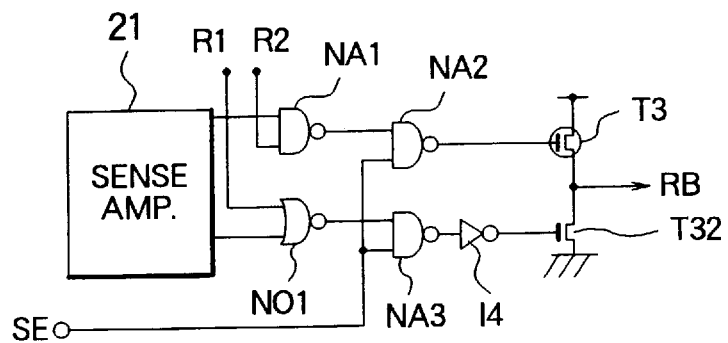
FIG. 5 is a circuit diagram of the sense amplifier block shown in FIG. 3.

Referring to FIG. 5, each of the sense amplifier blocks A1–An shown in FIG. 3 comprises a sense amplifier 21, NAND gates NA1–NA3, a NOR gate NO1, an inverter I4, a P-channel transistor T3, and an N-channel transistor T32. The NAND gate NA1 receives an output from the sense amplifier 21 and an output signal from the roll call circuit 12 through the node R2 as a gate signal. The NOR gate NO1 receives another output signal from the sense amplifier 21 and an output signal from the roll call circuit 12 through the node R1 as a gate signal. The NAND gate NA2 receives an output from the NAND gate NA1 and a signal SE as a gate signal that assumes "High" during a read operation. The NAND gate NA3 receives an output from the NOR gate NO1 and the SE signal. The P-channel transistor T3 receiving at the gate thereof an output from the NAND gate NA2 and the N-channel transistor T32 receiving at the gate thereof an output from the NAND gate NA3 through the inverter I4 are connected in series between the source line and the GND line, supplying an output signal at a node connecting the transistors T3 and T32 to a read bus line RB.

In a normal operation mode of the memory device of FIG. 3, where the fuse element FE1 in the fuse control block 20 has not yet been cut and accordingly the redundancy function has not been used, the input potential of the first inverter I2 in the fuse control block 20 is determined depending on the resistance divisional ratio between the fuse element FE1 and the N-channel transistor T31. Since the transistor T31 has a relatively high resistance, the input of the inverter I2 is "High", which is output through the inverters I2 and I1 to node Sn. In this case, the potentials of the nodes S1–Sn are "High" since any of the fuse elements F1–Fn has not yet been cut.

Accordingly, in the normal operation mode, pairs of second transistors T21–T2n having gate electrodes connected to respective nodes S1–Sn are "Off", the outputs of the inverters I31–I3n having inputs connected to the respective nodes S1–Sn are "Low", and pairs of first transistors T11–T1n having gate electrodes connected to the outputs of the respective inverters I31–I3n are "ON". Accordingly, the memory cell blocks M1–Mn are coupled with the respective data bus line pairs DB1–DBn, and data from selected memory cells are transferred to the respective sense amplifier blocks A1–An through the respective data bus line pairs DB1–DBn.

Further, in the normal operation mode, since the test mode signal TM is "High", the NOR gates N1–Nn in the roll call circuit 12 output "Low" at respective nodes R11–R1n and output "High" at respective nodes R21–R2n through the inverter SI1–SIn, regardless of the potentials of the nodes S1–Sn in the programmable circuit 11. The NAND gates NA1 and the NOR gates NO1 in the respective sense amplifier blocks A1–An then transfer the data from the sense amplifier 21 through the read bus lines RB1–RBn.

Assume that the redundant memory block MR is to be used to substitute for the last memory cell block Mn which has failed. In this case, the fuse element FE1 in the fuse control block 20 of the programmable circuit 11 and the fuse element Fn are cut by a laser beam and the like, which causes the drain potential of the transistor T31 to be "Low" in FIG. 4. Therefore, the fuse control block 20 in the programmable circuit 11 outputs "Low" to the node Sn through the inverters I2 and I1. The nodes $S_1$–$S_{n-1}$, other than the node Sn, is maintained "High" by the source potential, similarly to the case where no redundancy has been used.

The output signal of the inverter I3n receiving "Low" signal through the node Sn is "High", and causes the pair of first transistors T1n connected between the failed memory cell block Mn and the data bus line pair DBn, with the gate electrode thereof connected to the output of the inverter I3n, to be "OFF". This causes the failed memory cell block Mn to be electrically separated from the data bus line pair DBn. At the same time, the pair of second transistors T2n connected between the redundant memory cell block MR and the data bus line pair DBn, with the gate electrode thereof connected to the node Sn, turn "ON", which causes the redundant memory cell block MR to be electrically connected to the data bus line pair DBn, in stead of the memory cell block Mn.

Since the memory cell blocks $M_1$–$M_{n-1}$ for IO pads $I/O_1$–$I/O_{n-1}$ are coupled, similarly to the case wherein the redundancy is not used, with the respective data bus line pairs $DB_1$–$DB_{n-1}$, the data stored in the selected memory cells are transferred to a corresponding one of the sense amplifier blocks $A_1$–$A_{n-1}$ through the data bus line pairs. The data stored in the redundant memory cell block MR are transferred to the sense amplifier block An through the data bus line pair DBn. Besides, in the normal operation mode, since the test mode signal TM is "High", the NOR gates N1–Nn in the roll call circuit 12 output "Low" to the respective nodes R11–R1n, regardless of the potentials of the nodes S1–Sn in the programmable circuit 11. The NAND gates NA1 and the NOR gates NO1 in the respective sense amplifier blocks A1–An receive the "Low" through the respective nodes R11–R1n, and transfer the data from the sense amplifier 21 to the read bus lines RB1–RBn through the respective inverters I4.

It is to be noted that if a p-th memory cell block Mp is failed instead, the fuses FE1 and Fp are cut to turn the pairs of second transistors $T_{2(p+1)}$–$T_{2n}$ "On" and pairs of first transistors $T_{1p}$–$T_{1n}$ "Off". In this case, memory blocks $M_1$–$M_{(p-1)}$ are coupled with respective data bus line pairs $DB_1$–$DB_{(p-1)}$, memory cell blocks $M_{(p+1)}$–$M_n$ located behind the failed memory cell block Mp are coupled to the respective preceding data bus line pairs $DB_p$–$DB_{(n-1)}$, and the redundant memory cell block MR is coupled with the last data bus line pair DBn.

In a roll call test mode of the circuit shown in FIG. 3, assume that the memory cell block Mn for IO pad I/On has a failure and replaced by the redundant memory block MR.

Transfer of data from the memory cell blocks M1–Mn through respective sense amplifier blocks A1–An are effected in a manner similar to the described normal operation mode wherein the redundancy is used. In the roll call test, since the test mode signal TM assumes "Low", the output signals of the roll call circuit 12 are controlled based on the potentials of the respective nodes S1–Sn in the programmable circuit 11. In this case, since the potentials of the nodes $S_1$–$S_{n-1}$ are "High", the signals at nodes $R1_1$–$R1_{n-1}$ and at nodes $R2_1$–$R2_{n-1}$, to be supplied to the NAND gates NA1 and NOR gates NO1 in the respective sense amplifier blocks $A_1$–$A_{n-1}$, assume "Low", which allows the data from the respective sense amplifier 21 to be transferred to the respective read bus lines $RB_1$–$RB_{n-1}$.

Since the potential of the node Sn is "Low", the potential at node Sn and the test mode signal TM provide "High" at the output of the NOR gate Nn in the roll call circuit 12. The output of the NOR gate Nn is inverted by the inverter SIn to make the node R2n "Low". The NAND gate NA1 receiving the signal through the node R2n then outputs "High" regardless of the data supplied from the sense amplifier 21.

The NAND gate NA2 in the sense amplifier block An outputs "Low" by receiving an output from the NAND gate NA1 and the signal SE which is "High", to thereby turn on the P-channel transistor T3 receiving an output from the NAND gate NA2. The NAND gate NA3 outputs "High" by receiving an output from the NOR gate NO1 as a gate signal, which turns off the N-channel transistor T12 through the inverter I4. As a result, the sense amplifier block An transfers "High" to the read bus line RBn, regardless of the data given by the memory cells.

If all the memory cells in all the memory sections are written with "Low" data in the case as described above, the sense amplifier blocks $A_1$–$A_{n-1}$ in the normal memory sections output "Low" to the respective read bus lines $RB_1$–$RB_{n-1}$. On the other hand, in the failed memory section in which the redundant memory cell block has been used, the sense amplifier block An outputs "High" to the read bus line RBn. Thus, it is possible to judge whether or not and to which I/O pad the redundancy has been used.

In summary, if the redundancy function has been used, sense amplifier blocks A1–An are so controlled by the roll call circuit 12 that those I/O pads including a I/O pad corresponding to the failed memory block (referred to as a failed I/O pad hereinafter) and the I/O pads located behind the failed I/O pad, as viewed along the order of the numbering or arrangement of the memory blocks, supply fixed data regardless of the data supplied from the memory cell blocks, if the test mode signal TM is in the active level.

The fixed data supplied from the failed I/O pad or I/O pads located behind the failed I/O pad, wherein the redundancy function has been used, can be discriminated, regardless of the data supplied from the memory cell blocks. This enables to detect which I/O has been failed, or to which I/O the redundancy has been used.

Figure 6:
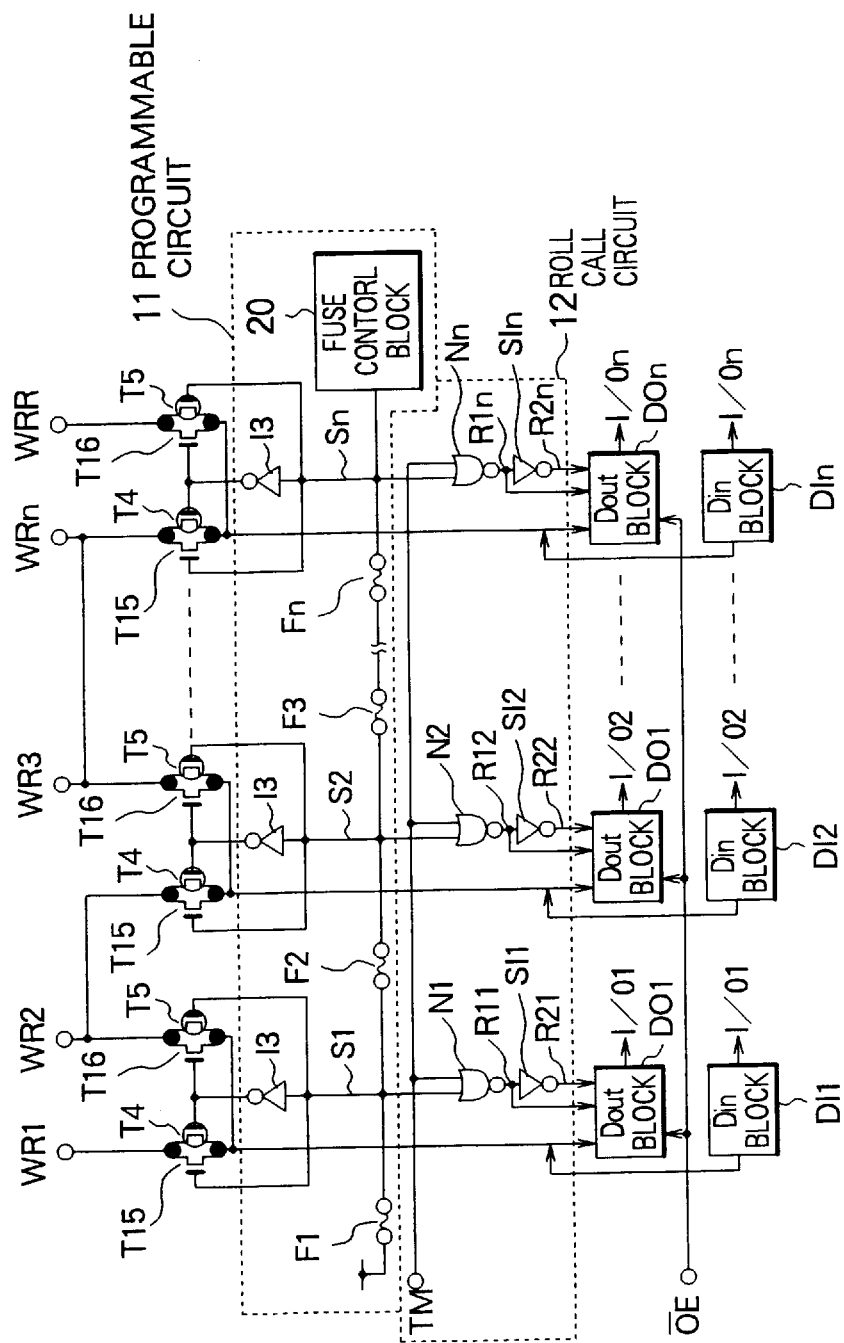
FIG. 6 is a circuit diagram of a semiconductor memory device according to a second embodiment of the present invention.

Referring to FIG. 6, a semiconductor memory device according to a second embodiment of the present invention comprises a plurality of (four, for example) memory sections each having n memory blocks, although the memory blocks and memory sections are not specifically depicted. The first memory blocks, for example, as well as other memory blocks, in all the memory sections are connected together across the memory sections to a corresponding write/read bus line WR1 for transferring output signals from those memory blocks through the write/read bus line.

In this embodiment, a single redundant memory block is provided in each of the memory sections. If a p-th memory block in any one of the memory sections is failed, then all the p-th memory blocks are replaced by the respective redundant memory blocks in the respective memory sections, and the following memory blocks located behind the failed I/O pad in each memory section are replaced by the respective memory blocks located successive to the following memory blocks. The redundant memory blocks are also connected together to a write/read bus line WRR for transferring output signals for the redundant memory cell blocks through the sense amplifier block not shown.

The semiconductor memory device has a common fuse control block 20, and a common programmable circuit 11. The programmable circuit 11 comprises a plurality of fuse elements F1–Fn of low resistance and inverters I3 in association therewith, and controls the use of the redundancy function. There are further provided with P-channel transistors T4 and T5, N-channel transistors T15 and T16, data output blocks DO1–DOn, data input blocks DI1–DIn and a roll call circuit 12.

A pair of transistors T4 and T15 function as transfer gates for coupling the data output blocks DO1–DOn or data input blocks DI1–DIn with the respective write/read bus lines WR1-WRn. A pair of transistors T16 and T5 function as transfer gates for coupling the data output blocks DO1–DOn or data input blocks DI1–DIn with the respective succeeding write/read bus lines $WR_2$–$WR_n$ and WRR.

When the redundancy function is not used, data on the write/read bus lines WR1–WRn are output by the data output blocks DO1–DOn through respective I/O pads I/O1–I/On. Data input through the I/O pads I/O1-I/On are transferred by the data input blocks DI1–DIn to the respective write/read bus lines WR1–WRn. The roll call circuit 12 has NOR gates N1–Nn and inverters SI1–SIn. The NOR gates N1–Nn receive a test mode signal TM and respective output signals from the programmable circuit 11. The inverters SI1–SIn receive output signals from the respective inverters N1–Nn. The output signals of the NOR gates N1–Nn and inverters SI1–SIn are input to NAND gates NA4 and NOR gates NO2 (see FIG.7) in the respective data output blocks DO1–DOn.

Figure 7:
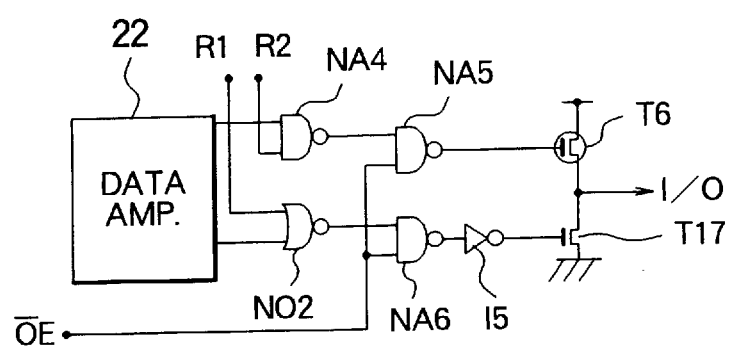
FIG. 7 is a circuit diagram of the data output block shown in FIG. 6.

The fuse control block 20 has a configuration shown in FIG. 4. FIG. 7 shows one of the data output blocks shown in FIG. 6, which comprises data amplifier 22, NAND gates NA4–NA6, a NOR gate NO2, a P-channel transistor T6, an N-channel transistor T17 and an inverter I5. The NAND gate NA4 receives an output from the data amplifier 22 and a signal through the node R2 from the roll call circuit 12 as a gate signal. The NAND gate NA5 receives an output from the NAND gate NA4 and a signal OE that becomes "High" in a read operation mode as a gate signal. The NOR gate NO2 receives an output from the data amplifier 12 and an output signal through the node R1 from the roll call circuit 12 as a gate signal. The NAND gate NA6 receives an output from the NOR gate NO2 and the signal OE as a gate signal. The transistor T6 receiving a gate input from the NAND gate NA6 and the transistor T17 receiving a gate input from the NAND gate through an inverter I5 are connected in series between the source line and the GND line. A node connecting the transistors T6 and T17 constitutes the output of the data output block.

In a normal operation mode of the circuit shown in FIG. 6, the programmable circuit 11 operates similarly to the programmable circuit shown in FIG. 3, when the redundancy function has not yet been used, to maintain the potentials of the nodes S1–Sn "High". This causes the transistors T5 to be "OFF", the transistors T15 to be "ON", and output signals of the inverters I3 to be "Low", because these elements have respective inputs commonly connected with the respective nodes S1–Sn. Further, the P-channel transistors T4 are "ON" and the N-channel transistors T16 are "OFF", because these transistors receive the outputs from the respective inverters I3. Accordingly, all the write/read bus lines WR1–WRn are coupled with the data output blocks DO1–DOn or data input blocks DI1–DIn and data on the write/read bus lines WR1–WRn are transferred to respective data output blocks DO1–DOn.

Since the test mode signal TM is "High" during the normal operation mode, the NOR gates N1–Nn output "Low" to the respective nodes R11–R1n, output "High" to the respective nodes R21–R2n through the inverters SI1–SIn, regardless of the potentials of the nodes S1–Sn in the programmable circuit 11. The NAND gate NA4 and NOR gate NO2 in the respective data output blocks DO1–DOn receive the data through the nodes R1 and R2, respectively, and transfer the data from the data amplifier 22 to the IO pads I/O1–I/On through the NAND gates NA5 and NA6 and the inverter I5.

Assume that a redundancy is used for a memory cell block for the I/On pad having a failure. The programmable circuit 11 in this case operates similarly to the operation described with reference to FIG. 3. Specifically, fuse FE1 and fuse Fn are cut by a laser beam, with the result that the potential of the node Sn is "Low", and the potentials of the nodes $S_1$–$S_{n-1}$ are maintained "High" by the source line. The output signal from the inverter I3 connected to the node Sn is "High", causing both the P-channel transistor T4 and N-channel transistor T15 for I/On connected between the write/read bus line WRn and the data output block DOn and having gate inputs from the inverter I3 and node Sn, respectively, to be "OFF". Thereby, the write/read bus line WRn for the I/On pad is electrically separated from the data output block DOn.

In the above case, the write/read bus lines $WR_1$–$WR_{n-1}$ for the IO pads $I/O_1$–$I/O_{n-1}$ are coupled with the respective data output blocks $DO_1$–$DO_{n-1}$ by the transistors T16 and T5, and data on these bus lines are transferred to the respective data output blocks, similarly to the case where the redundancy has not yet been used. Data on the write/read bus line WRR for the redundancy are transferred to the data output block DOn, as described above.

Since the test mode signal TM is "High" during the normal operation mode, the NOR gates N1–Nn output "Low" to the respective nodes R11–R1n, and output "High" to the respective nodes R21–R2n through the inverters SI1–SIn, regardless of the potentials of the nodes S1–Sn in the programmable circuit 11. The NAND gate NA4 and NOR gate NO2 in the respective data output blocks DO1–DOn receive the data on the nodes R11–R1n and R21–R2n, and transfer the data from the data amplifier 22 to the IO pads I/O1–I/On through the NAND gates NA5 and NA6 and the inverter I5.

In the roll call test operation of the circuit shown in FIG. 6, assume that redundancy is used for the memory block for the I/O pad I/On.

Transfer of data from write/read bus lines to respective data output blocks are performed in a manner similar to that described for the case of the normal operation mode wherein the redundancy is used. When judgment is to be performed whether or not the redundancy has been used, the test mode signal TM is made "High", causing respective output signals from the roll call circuit 12 to be determined by the potentials of the respective nodes S1–Sn in the programmable circuit 11. Since the potentials of the nodes $S_1$–$S_{n-1}$ are "High" in this case, "Low" is output to the respective nodes $R1_1$–$R1_{n-1}$ and "High" to the nodes $R2_1$–$R2_{n-1}$, which are used as the gate signals for the NAND gates NA4 and NOR gates NO2, respectively, in the data output blocks $DO_1$–$DO_{n-1}$. Accordingly, the data from the data amplifiers 22 are transferred to the IO pads $I/O_1$–$I/O_{n-1}$ as they stand.

Since the potential of the node Sn is "Low" and the test mode signal TM is "High", the NOR gate Nn outputs "High" to the node R1n, and "Low" to the node R2n through the inverter SIn. Accordingly, regardless of the data from the data amplifier 22, the NAND gate NA4 and NOR gate NO2 in the data output block DOn output "High" and "Low", respectively.

The NAND gate NA5, receiving an output from the NAND gate NA4 as a gate signal, outputs "Low" since the signal OE is "High", and turn on the P-channel transistor T6. The NAND gate NA6, receiving an output from the NOR gate NO2 as a gate signal, outputs "High", and turn off the N-channel transistor T17 through the inverter I5. Accordingly, the data output block DOn transfers "High" to the IOn pad regardless of the data supplied from the write/read bus line.

If "Low" is written for all the I/Os, the data output blocks $DO_1$–$DO_{n-1}$ output "Low" to the I/O pads $I/O_1$–$I/O_{n-1}$, and the data output block DOn outputs "High" to the I/O pad I/On. Therefore, it is possible to judge whether and to which I/O the redundancy has been used.

To summarize the above description, in the semiconductor memory devices according to the first and second embodiments, the redundancy function relieves the memory device from a failed memory cell block by electrically separating the bus lines from the failed memory cell block together with the memory cell blocks located behind the failed memory cell block, and by connecting those separated bus lines with the succeeding memory cell blocks including the redundant memory cell block. In this case, the roll call circuit enables to detect whether or not and to which I/O the redundancy function has been used, by making logical sum of output signals from the programmable circuit and the test mode signal, and by controlling the sense amplifier blocks or data output blocks in accordance with the result of the logical sum to output fixed data from the I/O pads including the failed one and those located behind the failed one, regardless of data read out from the memory cells. This is performed not by using a conventional redundancy decoder which is controlled according to changes in the address signals given from outside.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising: a plurality of memory cell blocks consecutively disposed in order and including a plurality of normal memory cell blocks and a redundant memory cell block succeeding said normal memory cell blocks; an I/O block including a plurality of I/O pads each corresponding to one of said normal memory cell blocks; a programmable circuit programmable for storing data for a failed memory cell block among said normal memory cell block to output redundancy control data; a switching section for coupling said I/O pads with respective said memory cell blocks based on said redundancy control data while excepting said failed memory cell block and including said redundant memory cell block; a data read section for reading data through said I/O pads; and a roll call circuit for controlling said data read section while controlling the data for specified I/O pads coupled with said failed memory cell blocks and succeeding memory cell blocks at a specified value.

2. A semiconductor memory device as defined in claim 1, wherein said programmable circuit comprises a first fuse element capable of cutting for representing the presence of a failed memory cell block, and a plurality of second fuse elements each corresponding to said normal memory block cells and capable of cutting for representing the presence of a failure in a corresponding one of said normal memory cell blocks, said second fuse elements are consecutively connected in series between a source line having a source level and a signal node having the source level or a ground level dependent on the absence or presence of cut of said first fuse element.

3. A semiconductor memory device as defined in claim 2, wherein said roll call circuit generates a logic sum of an input from a node connecting adjacent two of said second fuse elements and a test mode signal to control said data read section.

4. A semiconductor memory device as defined in claim 1, wherein said switch section comprises a plurality of first switches each for connecting a corresponding one of said I/O pads with a corresponding one of said normal memory cell blocks, and a plurality of second switches each for connecting a corresponding one of said I/O pads with one of said normal memory cell blocks disposed adjacent to said corresponding one of said normal memory cell blocks.

5. A semiconductor memory device as defined in claim 1, wherein said semiconductor memory device is divided in a plurality of memory sections each having said plurality of memory cell blocks.

6. A semiconductor memory device as defined in claim 5, wherein said plurality of I/O pads are disposed for each memory sections.

7. A semiconductor memory device as defined in claim 5, wherein said plurality of I/O pads are disposed in common for said plurality of memory sections.

* * * * *